United States Patent [19]
Lewiner et al.

[11] Patent Number: 5,942,994
[45] Date of Patent: Aug. 24, 1999

[54] METHOD AND DEVICE FOR DECODING A MULTIVALENT ELECTRICAL SIGNAL AND RECEIVER COMPRISING SUCH A DECODING DEVICE

[76] Inventors: Jacques Lewiner, 7, avenue de Suresnes, 92210 Saint-Cloud, France; Eric Carreel, 9, rue du Général Gouraud, 92190 Meudon, France

[21] Appl. No.: 08/776,547
[22] PCT Filed: Jul. 28, 1995
[86] PCT No.: PCT/FR95/01020
§ 371 Date: Aug. 27, 1997
§ 102(e) Date: Aug. 27, 1997
[87] PCT Pub. No.: WO96/04739
PCT Pub. Date: Feb. 15, 1996

[30] Foreign Application Priority Data

Aug. 1, 1994 [FR] France .................................. 94 09521

[51] Int. Cl.$^6$ .................................................. H03M 5/20
[52] U.S. Cl. ........................................ 341/56; 340/825.44
[58] Field of Search ............................... 341/56, 53, 155; 370/212; 340/825.2, 825.21, 825.44, 825.71

[56] References Cited

U.S. PATENT DOCUMENTS

| | | | |
|---|---|---|---|
| 3,991,379 | 11/1976 | Chadwick et al. ....................... | 328/139 |
| 4,163,209 | 7/1979 | McRae ............................... | 340/146.1 E |
| 5,204,879 | 4/1993 | McConnell ................................ | 375/20 |
| 5,670,951 | 9/1997 | Servilio et al. ..................... | 340/825.44 |
| 5,684,833 | 11/1997 | Watanabe ................................. | 375/286 |

FOREIGN PATENT DOCUMENTS

| | | |
|---|---|---|
| 2 703 548 A1 | 10/1994 | France . |
| 2 276 475 | 9/1994 | United Kingdom . |
| WO 90/16133 A1 | 12/1990 | WIPO . |

OTHER PUBLICATIONS

French Search Report dated Apr. 11, 1995, French Appl. No. FR 9409521.
International Search Report dated Oct. 23, 1995, International Appl. No. PCT/FR 95/01020.

*Primary Examiner*—Marc S. Hoff
*Assistant Examiner*—Peguy JeanPierre
*Attorney, Agent, or Firm*—Marshall, O'Toole, Gerstein, Murray & Borun

[57] ABSTRACT

To decode a multivalent electrical signal capable of taking up a number n of states greater than two, an electrical magnitude representative of the state of the signal is measured successively in successive pause periods of constant duration T during which said electrical magnitude remains substantially constant. The measurements are performed at constant time intervals starting from a time origin which is determined by performing close-together measurements during a synchronization period in order to identify the pause periods: the time origin is then fixed in the middle of one of said pause periods.

16 Claims, 1 Drawing Sheet

5,942,994

METHOD AND DEVICE FOR DECODING A MULTIVALENT ELECTRICAL SIGNAL AND RECEIVER COMPRISING SUCH A DECODING DEVICE

TECHNICAL FIELD

The present invention relates to methods and apparatuses for decoding multivalent electrical signals, and to receiver assemblies including such decoding apparatuses.

BACKGROUND OF THE INVENTION

More particularly, the invention relates to a method of decoding a multivalent electrical signal capable of taking up a number n of states greater than 2, said signal having a characteristic electrical magnitude U which varies over time to take up successive values each representing one of the n states of the electrical signal, the characteristic electrical magnitude substantially retaining said successive values during pause periods each of predetermined constant duration T, the method including the following steps:

a) measuring a value of the characteristic electrical magnitude of the signal during each pause period; and b) identifying the state represented by each measured value.

In such a method, it is difficult to choose the instant at which to perform each measurement. A measurement performed too near the beginning or the end of a pause can be falsified by the fact that the characteristic electrical magnitude does not remain exactly constant over the entire pause. Under such circumstances, identification of the state represented by the measured value can itself be falsified.

A particular object of the present invention is to mitigate these drawbacks.

To this end, according to the invention, a method of the kind in question is essentially characterized in that the characteristic electrical magnitude U is measured at instants that are separated from a time origin by an integer number of durations T, the time origin being determined by performing close-together measurements of said characteristic electrical magnitude during a predetermined synchronization period at instants that are spaced apart from one another by a duration T/m, where m is an integer not less than 3, said close-together measurements being used to identify the pause periods in the characteristic electrical magnitude U, with the time origin being set substantially in the middle of one of said pause periods.

In addition, unlike decoding a bivalent signal where it is easy to discriminate between a high level and a low level of the signal, identification of the state represented by each measured value can be disturbed relatively easily by variations in said characteristic electrical magnitude, which variations may be due, in particular to temperature variations of the electronic circuits processing the signal, and to aging of these circuits.

Also, when the decoding method is applied to an electrical signal that is the result of demodulating a previously picked-up radio signal, e.g. when the radio signal is modulated in frequency, in amplitude, or in phase, the disturbing variations in the characteristic electrical magnitude can also be due to the better or worse quality of reception of the radio signal.

SUMMARY OF THE INVENTION

In an advantageous embodiment of the invention, in order to adapt to disturbing variations in the characteristic electrical magnitude of the multivalent electrical signal, above-mentioned step b) is performed by comparing the measured value with n−1 thresholds $S_1, S_2, \ldots, S_{n-1}$ which define n ranges of values each corresponding to one state of the electrical signal, said thresholds being previously fixed at least as a function of a minimum value $U_1$ and of a maximum value $U_n$ of the characteristic electrical magnitude U as measured during a predetermined adaptation period.

In other preferred implementations of the method of the invention, use is made of one or more of the following dispositions:

a the various thresholds $S_1, S_2, \ldots, S_{n-1}$ are determined not only as a function of the measured values $U_1, U_2, \ldots, U_n$, but also as a function of ideal values $U_10, U_20, \ldots, U_n0$ that the characteristic electrical magnitude U ought to take for the various states of the signal;

the various thresholds are given by:

$$S_k = U_1 + (U_k0 - U_10)\frac{U_n - U_1}{U_n0 - U_10} + \tfrac{1}{2}(U_{k+1}0 - U_k0)\frac{U_n - U_1}{U_n0 - U_10} \qquad \text{II)}$$

where k is an integer lying in the range 1 to n−1, $U_10$ being the smallest of the above-mentioned ideal values, $U_n0$ being the largest of the above-mentioned ideal values, and $U_k0$ and $U_{k+1}0$ being respectively the k-th and the (k+1)-th of said ideal values in increasing order;

which values $U_1, U_2, \ldots U_n$ of the characteristic electrical magnitude U corresponding respectively to the n states of the signal are measured during the adaptation period, with the various thresholds then being given by:

$$S_k = \frac{U_k + U_{k+1}}{2}$$

where k is an integer number lying in the range 1 to n−1, $U_k$ and $U_{k+1}$ being respectively the k-th and the (k+1)-th of said measured values in increasing order;

the various thresholds are given by:

$$S_k = U_1 + (k - 0.5)\frac{U_n - U_1}{n - 1} \qquad \text{I)}$$

where k is an integer lying in the range 1 to n−1;

the n−1 thresholds $S_1, S_2, \ldots, S_{n-1}$ are regularly updated during decoding of the signal, by determining at least the minimum value $U_1$ and the maximum value $U_n$ of the characteristic electrical magnitude during successive adaptation periods;

while calculating the thresholds $S_1, S_2, \ldots, S_{n-1}$, the minimum value $U_1$ and the maximum value $U_n$ as determined during the adaptation period are compared respectively with first and second ranges of predetermined values, the minimum value being rejected if it does not lie within the first range of values and the maximum value being rejected if it does not lie within the second range of values;

the n−1 thresholds include a minimum threshold $S_1$ and a maximum threshold $S_{n-1}$, and during step b), each measured value of the characteristic electrical magnitude of the signal is compared firstly with a value $S_1-\Delta$ and secondly with a value $S_{n-1}+\Delta$, $\Delta$ being a predetermined value, the measured value not being taken into account if it is less than $S_1-\Delta$ or greater than $S_{n-1}+\Delta$;

the value Δ represent a constant fraction of the difference between the maximum threshold $S_{n-1}$ and the minimum threshold $S_1$;

m is an integer not less than 7; and the electrical signal is the result of demodulating a modulated radio signal.

The invention also provides apparatus for decoding a multivalent electrical signal capable of taking up a number n of states greater than 2, said signal having a characteristic electrical magnitude U which varies over time to take successive values each representative of one of the n states of the electrical signal, the characteristic electrical magnitude substantially conserving said successive values during pause periods each having a predetermined constant duration T, said apparatus including decoder means to:

a) measure a value of the characteristic electrical magnitude of the signal during each pause period; and b) identify the state represented by each measured value; the apparatus being characterized in that the decoder means measure the electrical magnitude at instants that are separated from a time origin by an integer number of durations T, said decoder means being designed to determine the time origin by performing close-together measurements of said characteristic electrical magnitude during a predetermined synchronization period at instants which are spaced apart from one another by a duration T/m, where m is an integer not less than 3, the decoder means also being designed to use said close-together measurements to identify the pause periods of the characteristic electrical magnitude U, and the decoder means finally being designed to set the time origin substantially in the middle of one of said pause periods.

In preferred embodiments of the decoding apparatus of the invention, use is made of one or more of the following dispositions:

the decoder means are designed to identify the state represented by each measured value by comparing said measured value with n−1 thresholds $S_1, S_2, \ldots, S_{n-1}$ defining n ranges of values each corresponding to one state of the electrical signal, the decoder means also being designed initially to set said thresholds at least as a function of a minimum value $U_1$ and of a maximum value $U_n$ of the characteristic electrical magnitude U as measured during a predetermined adaptation period; and the decoder means are designed during said adaptation period to measure the values $U_1, U_2, \ldots, U_n$ of the characteristic electrical magnitude corresponding respectively to the n states of the signal, and to calculate the various thresholds using the following formula:

$$S_k = \frac{U_k + U_{k+1}}{2}$$

where k is an integer lying in the range 1 to n−1, and the apparatus further includes a non-volatile memory in which said various values $U_1, U_2, \ldots, U_n$ measured during the adaptation period are stored.

The invention also provides a receiver assembly including an antenna for receiving a frequency modulated radio signal, means for generating a demodulated electrical signal from the frequency modulated radio signal picked up by the antenna, and apparatus as defined above, for decoding the demodulated electrical signal.

Other characteristics and advantages of the invention appear from the following detailed description of an embodiment thereof, given by way of non-limiting example and with reference to the accompanying drawing.

DESCRIPTION OF THE PREFERRED EMBODIMENTS

Figure 1:
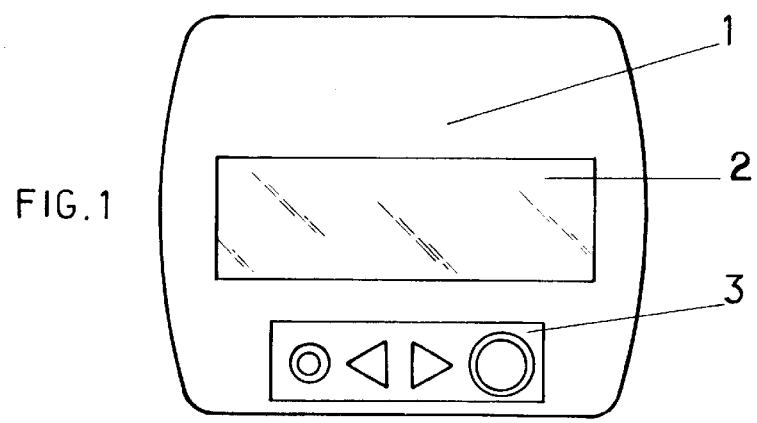
FIG. 1 is an overall view of a radio-paging receiver suitable for receiving and decoding multivalent signals of the present invention.

The present invention applies particularly, but in non-limiting manner, to a portable pager 1 shown in FIG. 1.

The pager 1 can receive radio messages, and it has a screen 2 for displaying the messages and a keypad 3 serving, in particular, to scroll the messages, to erase them, etc.

Figure 2:
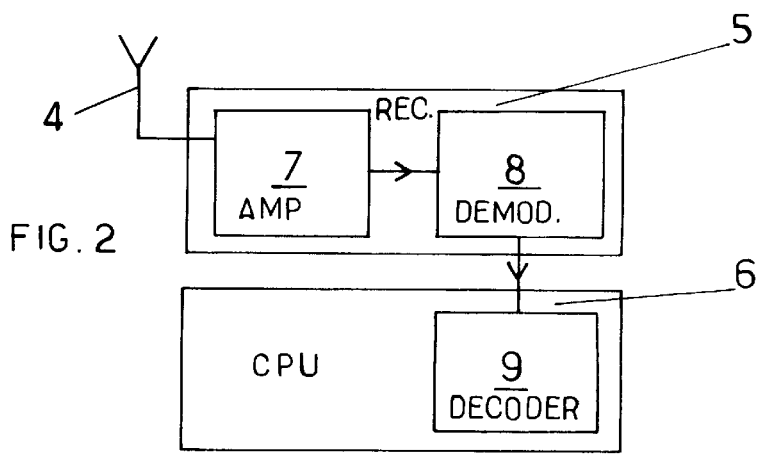
FIG. 2 is a block diagram of a portion of the receiver assembly of FIG. 1.

As shown diagrammatically in FIG. 2, the pager 1 contains in particular a receiver 5 and a central processor unit (CPU) 6 which may be constituted by a microprocessor provided with a clock.

The receiver 5 includes an amplifier 7 and a demodulator 8, the amplifier 7 having an input connected to an antenna 4 and an output connected to an input of the demodulator 8, the demodulator 8 itself having an output connected to an analog input of the CPU 6.

The pager 1 is specially designed to receive a multivalent modulated radio signal capable of taking a number n of states greater than 2, and in the present case equal to 4.

Also, the invention is applicable more specifically, but in non-limiting manner, to the case where the radio signal is frequency modulated.

Even more specifically, but again in non-limiting manner, the invention applies to the case where the radio signal is transmitted in compliance with the European ERMES standard (EEC Directives 85/374 and 92/59).

The radio signal is received by the antenna 4, amplified by the amplifier 7, and demodulated by the demodulator 8, which generates a demodulated signal d.

Figure 3:
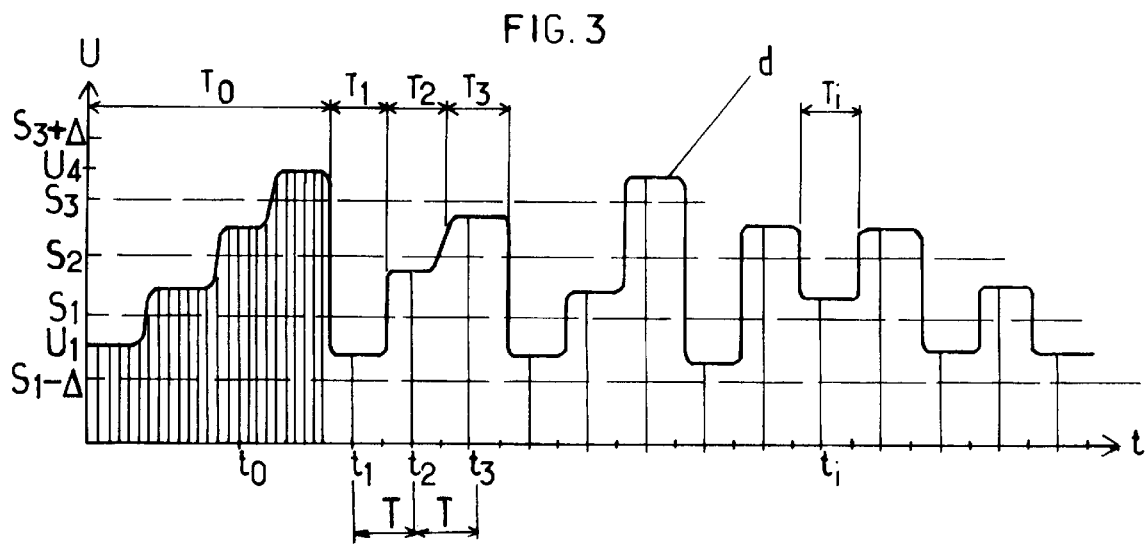
FIG. 3 shows one example of variation in the electrical signal that results from demodulating the radio signal picked up by the receiver assembly of FIG. 1.

As shown in FIG. 3, the demodulated signal d output by the demodulator 8 presents a voltage U that varies over time, successively taking up values each representative of one of four states of the radio signal, the voltage U substantially retaining these successive values during time periods referred to as "pauses" $T_1, T_2, T_3, \ldots, T_i$, each having a constant predetermined duration T.

The demodulated signal d generated at the output of the demodulator 8 is processed within the CPU 6 by a decoder 9 generally constituted by a program loaded in the CPU 6.

Each time the pager 1 is switched on, the decoder 9 begins by synchronizing itself with the demodulated signal d by performing a large number of measurements of the voltage U at instants that are very close together, and it does this for a synchronization period $T_0$.

During this synchronization period, measurements of the voltage U are performed at instants which are spaced apart from one another by a duration T/m where m is an integer not less than 3, and preferably not less than 7.

By means of these close-together measurements, the decoder 9 identifies the various pause periods within the synchronization period $T_0$, and it sets a time origin $t_0$ substantially in the middle of one of the pause periods.

After the synchronization period $T_0$, the decoder 9 performs a single measurement of the voltage U for each pause period $T_1, T_2, T_3, \ldots, T_i$, at instants $t_1, t_2, t_3, \ldots, t_i$ which are each separated from the time origin $t_0$ by an integer number of predetermined durations T.

Optionally, after operating for a certain length of time, the decoder 9 may resynchronize itself with the demodulated signal d by repeating the above-described process.

Also, to identify the state of the signal corresponding to each measured value of the voltage U at instants $t_1, t_2, t_3, \ldots, t_i$, the decoder 9 compares each measured value of the voltage U with three thresholds $S_1, S_2, S_3$ which define four ranges of values each corresponding to one of the states of the electrical signal:

| STATE | VALUE RANGE |
|---|---|
| 00 | $U < S_1$ |
| 01 | $S_1 \leq U < S_2$ |
| 11 | $S_2 \leq U < S_3$ |
| 10 | $S_3 \leq U$ |

The three thresholds $S_1, S_2, S_3$ are preferably previously fixed by determining a minimum value $U_1$ and a maximum value $U_4$ of the voltage U during an adaptation period, with the various thresholds then being given by:

$$S_k = U_1 + (k - 0.5)\frac{U_4 - U_1}{3} \quad \text{I)}$$

where k is an integer lying in the range 1 to 3.

When the differences between the various values $U_1, U_2, U_3, U_4$ are not equal, in particular when the demodulator 8 is not linear, it is possible to calculate the various thresholds $S_1, S_2, S_3$, not using formula I) above, but as a function of ideal values $U_1 0, U_2 0, U_3 0, U_4 0$ that the voltage U ought to take up for the various states of the signal, said ideal values being stored in a non-volatile memory, e.g. a memory of the EEPROM type in the decoder 9.

The values of the various thresholds then become $$S_k = U_1 + (U_k 0 - U_1 0)\frac{U_4 - U_1}{U_4 0 - U_1 0} + \tfrac{1}{2}(U_{k+1} 0 - U_k 0)\frac{U_4 - U_1}{U_4 0 - U_1 0} \quad \text{II)}$$

where k is an integer in the range 1 to 3.

It is also possible to measure the values $U_1, U_2, U_3, U_4$ of the voltage U during the adaptation period and then to calculate the various thresholds using the formula:

$$S_k = \frac{U_k + U_{k+1}}{2}$$

where k is an integer number lying in the range 1 to 3.

In this case, the values $U_1, U_2, U_3, U_4$ measured during the adaptation period are preferably then stored in a non-volatile memory of the decoder 9.

When the pager is switched on, the adaptation period may coincide with the synchronization period $T_0$, or the adaptation period may be subsequent to the synchronization period $T_0$. The thresholds $S_1, S_2, S_3$ are preferably updated regularly while decoding the signal d, by determining the minimum and maximum values $U_1$ and $U_4$ of the voltage during successive adaptation periods, said adaptation periods possibly recurring at regular time intervals, or else adaptation can be performed continuously so that the adaptation period then corresponds, for example, to the p most recent measurements of the voltage U, where p is an integer.

Also, when calculating the thresholds $S_1, S_2, S_3$, it is possible to compare the values $U_1$ and $U_4$ respectively with a first and with a second range of predetermined values, the value $U_1$ not being taken into account unless it is situated within the first range of values, and the value $U_4$ not being taken into account unless it is situated in the second range of values.

Optionally, during decoding, the measured values of the voltage U that are less than a value $S_1 - \Delta$ or greater than a value $S_3 + \Delta$, where $\Delta$ is a predetermined voltage, are eliminated as being interference.

The voltage $\Delta$ may optionally be a constant fraction of the difference between the maximum threshold $S_3$ and the minimum threshold $S_1$, e.g. $\Delta = \tfrac{1}{2}(S_3 - S_1)$ as shown in FIG. 3.

Naturally, and as can be seen from the above, the invention is not limited in any way to those applications and embodiments that have been considered more particularly, on the contrary it extends to any variant.

We claim:

1. A method of decoding a multivalent electrical signal (d) capable of taking up a number n of states greater than 2, said signal having a characteristic electrical magnitude U which varies over time to take up successive values each representing one of the n states of the electrical signal (d), the characteristic electrical magnitude substantially retaining said successive values during pause periods $(T_1, T_2, T_3, \ldots, T_i)$ each of predetermined constant duration T, the method including the following steps:

a) measuring a value of the characteristic electrical magnitude of the signal during each pause period $(T_1, T_2, T_3, \ldots, T_i)$; and b) identifying the state represented by each measured value;

the method being characterized in that the characteristic electrical magnitude U is measured at instants $(t_1, t_2, \ldots, t_i)$ that are separated from a time origin $(t_0)$ by an integer number of durations T, the time origin $(t_0)$ being determined by performing close-together measurements of said characteristic electrical magnitude during a predetermined synchronization period at instants that are spaced apart from one another by a duration T/m, where m is an integer not less than 3, said close-together measurements being used to identify the pause periods in the characteristic electrical magnitude U, with the time origin $(t_0)$ being set substantially in the middle of one of said pause periods.

2. A method according to claim 1, in which above-mentioned step b) is performed by comparing the measured value with n−1 thresholds $S_1, S_2, \ldots, S_{n-1}$ which define n ranges of values each corresponding to one state of the electrical signal, said thresholds being previously fixed at least as a function of a minimum value $U_1$ and of a maximum value $U_n$ of the characteristic electrical magnitude U as measured during a predetermined adaptation period.

3. A method according to claim 2, in which the various thresholds $S_1, S_2, \ldots, S_{n-1}$ are determined not only as a function of the measured values $U_1, U_2, \ldots, U_n$, but also as a function of ideal values $U_1 0, U_2 0, \ldots, U_n 0$ that the characteristic electrical magnitude U ought to take for the various states of the signal.

4. A method according to claim 3, in which the various thresholds are given by:

$$S_k = U_1 + (U_k 0 - U_1 0)\frac{U_n - U_1}{U_n 0 - U_1 0} + \frac{1}{2}(U_{k+1} 0 - U_k 0)\frac{U_n - U_1}{U_n 0 - U_1 0} \quad \text{II})$$

where k is an integer lying in the range 1 to n−1, $U_1 0$ being the smallest of the above-mentioned ideal values, $U_n 0$ being the largest of the above-mentioned ideal values, and $U_k 0$ and $U_{k+1} 0$ being respectively the k-th and the (k+1)-th of said ideal values in increasing order.

5. A method according to claim 2, in which values $U_1$, $U_2$, ..., $U_n$ of the characteristic electrical magnitude U corresponding respectively to the n states of the signal are measured during the adaptation period, with the various thresholds then being given by:

$$S_k = \frac{U_k + U_{k+1}}{2}$$

where k is an integer number lying in the range 1 to n−1, $U_k$ and $U_{k+1}$ being respectively the k-th and the (k+1)-th of said measured values in increasing order.

6. A method according to claim 2, in which the various thresholds are given by:

$$S_k = U_1 + (k - 0.5)\frac{U_n - U_1}{n - 1} \quad \text{I})$$

where k is an integer lying in the range 1 to n−1.

7. A method according to any one of claims 2 to 6, in which the n−1 thresholds $S_1, S_2, \ldots, S_{n-1}$ are regularly updated during decoding of the signal (d), by determining at least the minimum value $U_1$ and the maximum value $U_n$ of the characteristic electrical magnitude during successive adaptation periods.

8. A method according to any one of claims 2 to 7, in which, while calculating the thresholds $S_1, S_2, \ldots, S_{n-1}$, the minimum value $U_1$ and the maximum value $U_n$ as determined during the adaptation period are compared respectively with first and second ranges of predetermined values, the minimum value being rejected if it does not lie within the first range of values and the maximum value being rejected if it does not lie within the second range of values.

9. A method according to any one of claims 2 to 8, in which the $n_n\_1$ thresholds include a minimum threshold $S_1$ and a maximum threshold $S_{n-1}$, and in which, during step b), each measured value of the characteristic electrical magnitude of the signal is compared firstly with a value $S_1-\Delta$ and secondly with a value $S_{n-1}+\Delta$, $\Delta$ being a predetermined value, the measured value not being taken into account if it is less than $S_1\Delta$ or greater than $S_{n-1}+\Delta$.

10. A method according to claim 9, in which the value $\Delta$ represent a constant fraction of the difference between the maximum threshold $S_{n-1}$ and the minimum threshold $S_1$.

11. A method according to any preceding claim, in which m is an integer not less than 7.

12. A method according to any preceding claim, in which the electrical signal (d) is the result of demodulating a modulated radio signal.

13. Apparatus for decoding a multivalent electrical signal (d) capable of taking up a number n of states greater than 2, said signal having a characteristic electrical magnitude U which varies over time to take successive values each representative of one of the n states of the electrical signal (d), the characteristic electrical magnitude substantially conserving said successive values during pause periods ($T_1$, $T_2$, $T_3$, ..., $T_i$) each having a predetermined constant duration T, said apparatus including decoder means (9) to:

a) measure a value of the characteristic electrical magnitude of the signal during each pause period ($T_1$, $T_2$, $T_3$, ..., $T_i$); and b) identify the state represented by each measured value; the apparatus being characterized in that the decoder means (9) measure the electrical magnitude at instants ($t_1, t_2, \ldots, t_i$) that are separated from a time origin ($t_0$) by an integer number of durations T, said decoder means (9) being designed to determine the time origin ($t_0$) by performing close-together measurements of said characteristic electrical magnitude during a predetermined synchronization period at instants which are spaced apart from one another by a duration T/m, where m is an integer not less than 3, the decoder means also being designed to use said close-together measurements to identify the pause periods of the characteristic electrical magnitude U, and the decoder means (9) finally being designed to set the time origin ($t_0$) substantially in the middle of one of said pause periods.

14. Apparatus according to claim 13, in which the decoder means (9) are designed to identify the state represented by each measured value by comparing said measured value with n−1 thresholds $S_1, S_2, \ldots, S_{n-1}$ defining n ranges of values each corresponding to one state of the electrical signal, the decoder means also being designed initially to set said thresholds at least as a function of a minimum value $U_1$ and of a maximum value $U_n$ of the characteristic electrical magnitude U as measured during a predetermined adaptation period.

15. Apparatus according to claim 14, in which the decoder means are designed during said adaptation period to measure the values $U_1, U_2, \ldots, U_n$ of the characteristic electrical magnitude corresponding respectively to the n states of the signal, and to calculate the various thresholds using the following formula:

$$S_k = \frac{U_k + U_{k+1}}{2}$$

where k is an integer lying in the range 1 to n−1, and the apparatus further includes a non-volatile memory in which said various values $U_1, U_2, \ldots, U_n$ measured during the adaptation period are stored.

16. A receiver assembly (1) including an antenna (4) for receiving a frequency modulated radio signal, means (7, 8) for generating a demodulated electrical signal (d) from the frequency modulated radio signal picked up by the antenna (4), and apparatus according to any one of claims 13 to 15, for decoding the demodulated electrical signal (d).

* * * * *